United States Patent
Jiang et al.

(10) Patent No.: US 7,943,942 B2
(45) Date of Patent: May 17, 2011

(54) SEMICONDUCTOR LIGHT-EMITTING DEVICE WITH DOUBLE-SIDED PASSIVATION

(75) Inventors: Fengyi Jiang, Nanchang (CN); Junlin Liu, Jiang Xi (CN); Li Wang, Jiang Xi (CN)

(73) Assignee: Lattice Power (JIANGXI) Corporation, Nanchang (CN)

( * ) Notice: Subject to any disclaimer, the term of this patent is extended or adjusted under 35 U.S.C. 154(b) by 0 days.

(21) Appl. No.: 12/093,508

(22) PCT Filed: Mar. 25, 2008

(86) PCT No.: PCT/CN2008/000581
§ 371 (c)(1),
(2), (4) Date: May 13, 2008

(87) PCT Pub. No.: WO2009/117845
PCT Pub. Date: Oct. 1, 2009

(65) Prior Publication Data
US 2011/0001120 A1 Jan. 6, 2011

(51) Int. Cl.
*H01L 21/00* (2006.01)
(52) U.S. Cl. .......... 257/94; 257/80; 257/82; 257/97; 257/99; 257/E29.078; 257/E33.005; 257/E33.008; 257/E33.066; 257/E33.068; 438/32; 438/33; 438/34
(58) Field of Classification Search ............ 257/46, 257/80–82, 94–99, E29.078, 33.005–33.008, 257/66–68; 438/22–34
See application file for complete search history.

(56) References Cited

U.S. PATENT DOCUMENTS

| | | | |
|---|---|---|---|
| 5,925,896 A | 7/1999 | Dutta | |
| 6,744,196 B1 | 6/2004 | Jeon | |
| 6,893,889 B2 * | 5/2005 | Park et al. | 438/22 |
| 6,900,472 B2 * | 5/2005 | Kondoh et al. | 257/94 |
| 6,992,318 B2 * | 1/2006 | Lee et al. | 257/15 |
| 7,195,944 B2 * | 3/2007 | Tran et al. | 438/46 |
| 7,250,633 B2 * | 7/2007 | Seo et al. | 257/82 |
| 7,432,119 B2 * | 10/2008 | Doan | 438/33 |
| 7,741,632 B2 * | 6/2010 | Xiong et al. | 257/13 |
| 2005/0006664 A1 | 1/2005 | Inoue | |
| 2007/0090378 A1 | 4/2007 | Lee | |

FOREIGN PATENT DOCUMENTS

| | | | |
|---|---|---|---|
| WO | 2007036164 A1 | | 4/2007 |
| WO | WO2009117845 | * | 1/2009 |
| WO | WO2010002070 | * | 2/2010 |
| WO | WO2010020067 | * | 2/2010 |

* cited by examiner

*Primary Examiner* — Michael S Lebentritt
(74) *Attorney, Agent, or Firm* — Park, Vaughan, Fleming & Dowler LLP; Shun Yao

(57) ABSTRACT

A light-emitting device includes a substrate, a first doped semiconductor layer situated above the substrate, a second doped semiconductor layer situated above the first doped layer, and a multi-quantum-well (MQW) active layer situated between the first and the second doped layers. The device also includes a first electrode coupled to the first doped layer and a first passivation layer situated between the first electrode and the first doped layer in areas other than an ohmic-contact area. The first passivation layer substantially insulates the first electrode from edges of the first doped layer, thereby reducing surface recombination. The device further includes a second electrode coupled to the second doped layer and a second passivation layer which substantially covers the sidewalls of the first and second doped layers, the MQW active layer, and the horizontal surface of the second doped layer.

20 Claims, 3 Drawing Sheets

SEMICONDUCTOR LIGHT-EMITTING DEVICE WITH DOUBLE-SIDED PASSIVATION

This application is a U.S. National Stage application under 35 U.S.C. section 371 of PCT Application No. PCT/CN2008/000581, entitled "SEMICONDUCTOR LIGHT-EMITTING DEVICE WITH DOUBLE-SIDED PASSIVATION," by inventors Fengyi Jiang, Junlin Liu, and Li Wang, filed 25 Mar. 2008.

BACKGROUND

1. Field of the Invention

The present invention relates to the design of semiconductor light-emitting devices. More specifically, the present invention relates to novel semiconductor light-emitting devices with double-sided passivation that effectively reduces the leakage current and enhances the device reliability.

2. Related Art

Solid-state lighting is expected to bring the next wave of illumination technology. High-brightness light-emitting diodes (HB-LEDs) are emerging in an increasing number of applications, from serving as the light source for display devices to replacing light bulbs for conventional lighting. Typically, cost, efficiency, and brightness are the three foremost metrics for determining the commercial viability of LEDs.

An LED produces light from an active region which is "sandwiched" between a positively doped layer (p-type doped layer) and a negatively doped layer (n-type doped layer). When the LED is forward-biased, the carriers, which include holes from the p-type doped layer and electrons from the n-type doped layer, recombine in the active region. In direct band-gap materials, this recombination process releases energy in the form of photons, or light, whose wavelength corresponds to the band-gap energy of the material in the active region.

To ensure high efficiency of an LED, it is desirable to have the carriers recombine only in the active region instead of other places such as the lateral surface of the LED. However, due to the abrupt termination of the crystal structure at the lateral surface of the LED, there are large numbers of recombination centers on such surface. In addition, the surface of an LED is very sensitive to its surrounding environment, which may lead to added impurities and defects. Environmentally induced damage can severely degrade the reliability and stability of an LED. In order to insulate an LED from various environmental factors, such as humidity, ion impurity, external electrical field, heat, etc., and to maintain the functionality and stability of the LED, it is important to pay special care to maintain the surface cleanness and to ensure reliable LED packaging. Moreover, it is also critical to protect the surface of an LED using surface passivation, which typically involves depositing a thin layer of non-reactive material on the surface of the LED.

FIG. 1 illustrates a traditional passivation method for an LED with a vertical-electrode configuration. In FIG. 1, from top down, a layer 100 is the passivation layer, a layer 102 the n-side (or p-side) electrode, a layer 104 the n-type (or p-type) doped semiconductor layer, a layer 106 the active layer based on a multi-quantum-well (MQW) structure, a layer 108 the p-type (or n-type) doped semiconductor layer, a layer 110 the p-side (or n-side) electrode, and a layer 112 is the substrate.

The passivation layer blocks the undesired carrier recombination at the LED surface. For the vertical-electrode LED structure shown in FIG. 1, surface recombination tends to occur on the sidewalls of the MQW active region 106. However, the sidewall coverage by a conventional passivation layer, for example, layer 100 shown in FIG. 1, is often non-ideal. The poor sidewall coverage is typically a result of standard thin-film deposition techniques, such as plasma-enhanced chemical vapor deposition (PECVD) and magnetron sputtering deposition. The quality of sidewall coverage by passivation layer is worsened for devices with steeper steps, such as devices with steps higher than 2 µm, which is the case for most vertical-electrode LEDs. Under such conditions, the passivation layer often contains a large number of pores, which can severely degrade its ability to block the surface recombination of carriers. An increased surface recombination rate in turn increases the amount of the reverse leakage current, which results in reduced efficiency and stability of the LED.

SUMMARY

One embodiment of the present invention provides a light-emitting device. The device includes a substrate, a first doped semiconductor layer situated above the substrate, a second doped semiconductor layer situated above the first doped semiconductor layer, and a multi-quantum-well (MQW) active layer situated between the first and the second doped semiconductor layers. The device also includes a first electrode coupled to the first doped semiconductor layer and a first passivation layer, which is situated between the first electrode and the first doped semiconductor layer in areas other than an ohmic-contact area. The first passivation layer substantially insulates the first electrode from edges of the first doped semiconductor layer, thereby reducing surface recombination. The device further includes a second electrode coupled to the second doped semiconductor layer and a second passivation layer which substantially covers the sidewalls of the first and second doped semiconductor layer, the MQW active layer, and part of the horizontal surface of the second doped semiconductor layer which is not covered by the second electrode.

In a variation on this embodiment, the substrate comprises at least one of the following materials: Cu, Cr, Si, and SiC.

In a variation on this embodiment, the first and/or second passivation layer comprises at least one of the following materials: $SiO_x$, $SiN_x$, and $SiO_xN_y$.

In a variation on this embodiment, the first doped semiconductor layer is a p-type doped semiconductor layer.

In a variation on this embodiment, the second doped semiconductor layer is an n-type doped semiconductor layer.

In a variation on this embodiment, the MQW active layer comprises GaN and InGaN.

In a variation on this embodiment, the first and second doped semiconductor layers are grown on a substrate with a predefined pattern comprising grooves and mesas.

In a variation on this embodiment, the first and/or second passivation layer is formed by one of the following processes: plasma-enhanced chemical vapor deposition (PECVD), magnetron sputtering deposition, and electron beam (e-beam) evaporation.

In a variation on this embodiment, the thickness of the first passivation layer is between 100 and 2,000 angstrom, and the thickness of the second passivation layer is between 300 and 10,000 angstrom.

In a variation on this embodiment, a substantial distance is present between the edge of the first electrode and the edge of other layers.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Overview

Embodiments of the present invention provide a method for fabricating an LED device with double-sided passivation. Two sides of passivation which cover both the top and bottom sides of the device can effectively reduce surface recombination of the carriers, resulting in improved reliability of the LED device. In one embodiment, instead of depositing only a single layer of passivation at the outer surface of the LED, two passivation layers (a top passivation layer and a bottom passivation layer) are deposited. The presence of the bottom passivation layer provides substantial insulation between the sidewalls of the p-type (or n-type) doped layer and the contact of the p-side (or n-side) electrode. Furthermore, because the bottom passivation layer is deposited on a horizontal surface rather than the vertical sidewalls of the layered semiconductor structure, this bottom passivation layer avoids the typical sidewall-coverage problem associated with common thin-film deposition techniques. Therefore, the bottom passivation layer often demonstrates a much better surface quality than that of a conventional single-sided passivation layer.

Preparing the Substrate

InGaAlN ($In_xGa_yAl_{1-x-y}N$, $0<=x<=1$, $0<=y<=1$) is one of the optimal materials for manufacturing short-wavelength light-emitting devices. In order to grow a crack-free multilayer InGaAlN structure on a conventional large-area substrate (such as a Si wafer) to facilitate the mass production of high-quality, low-cost, short-wavelength LEDs, a growth method that pre-patterns the substrate with grooves and mesas is introduced. Pre-patterning the substrate with grooves and mesas can effectively release the stress in the multilayer structure that is caused by lattice-constant and thermal-expansion-coefficient mismatches between the substrate surface and the multilayer structure.

Figure 1:
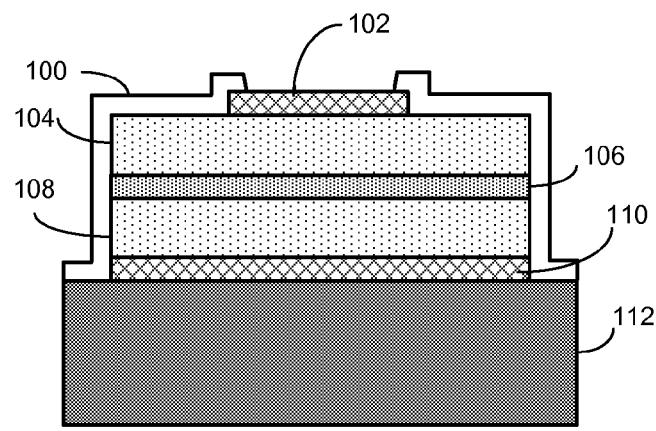
FIG. 1 illustrates a traditional passivation method for an LED with a vertical-electrode configuration.
Figure 2A:
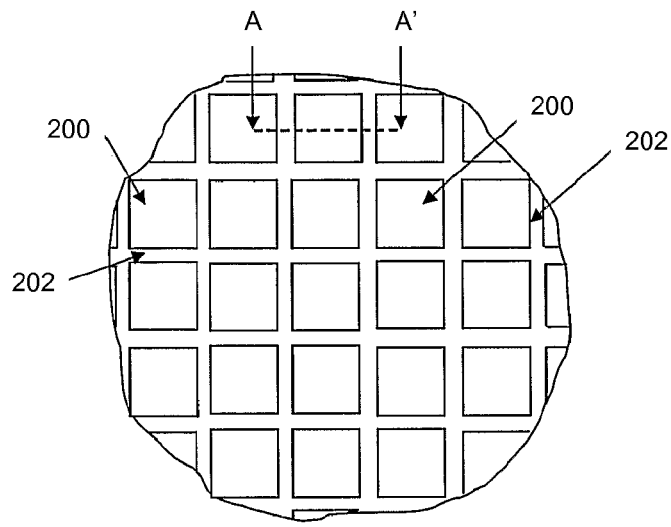
FIG. 2A illustrates part of a substrate with pre-patterned grooves and mesas in accordance with one embodiment of the present invention.
Figure 2B:
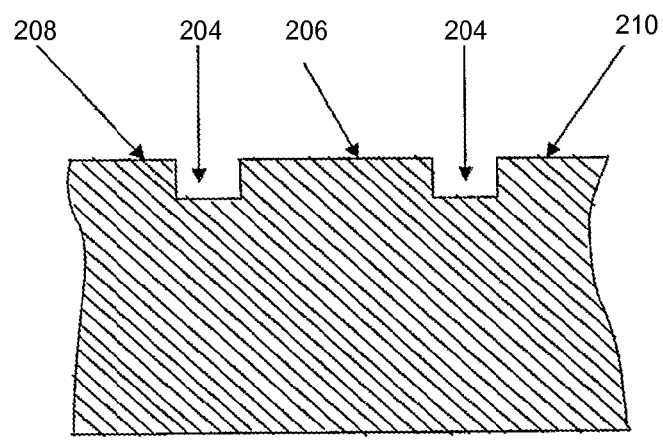
FIG. 2B illustrates the cross-section of a pre-patterned substrate in accordance with one embodiment of the present invention.

FIG. 2A illustrates a top view of a part of a substrate with a pre-etched pattern using photo lithographic and plasma etching techniques in accordance with one embodiment of the present invention. Square mesas 200 and grooves 202 are the result of the etching. FIG. 2B more clearly illustrates the structure of mesas and grooves by showing a cross-section of the pre-patterned substrate along a horizontal line AA' in FIG. 2A in accordance with one embodiment. As seen in FIG. 2B, the sidewalls of grooves 204 effectively form the sidewalls of the isolated mesa structures, such as mesa 206, and partial mesas 208 and 210. Each mesa defines an independent surface area for growing a respective semiconductor device.

Note that it is possible to apply different lithographic and etching techniques to form the grooves and mesas on the semiconductor substrate. Also note that other than forming square mesas 200 as shown in FIG. 2A, alternative geometries can be formed by changing the patterns of grooves 202. Some of these alternative geometries can include, but are not limited to: triangle, rectangle, parallelogram, hexagon, circle, or other non-regular shapes.

Fabricating the Light-Emitting Device with Double-Sided Passivation

Figure 3:
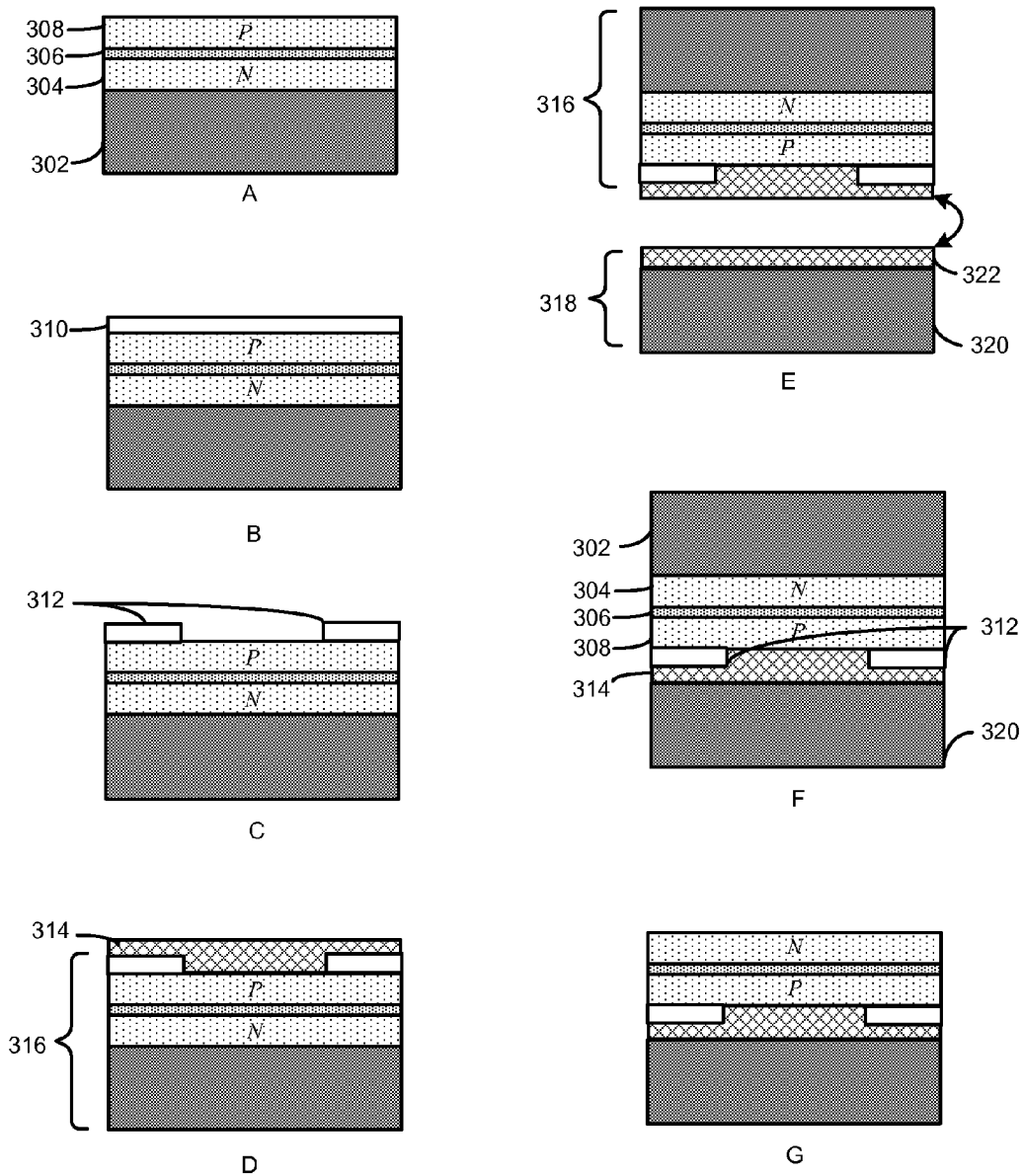
FIG. 3 presents a diagram illustrating the process of fabricating a light-emitting device with double-sided passivation in accordance with one embodiment of the present invention.
Figure 3:
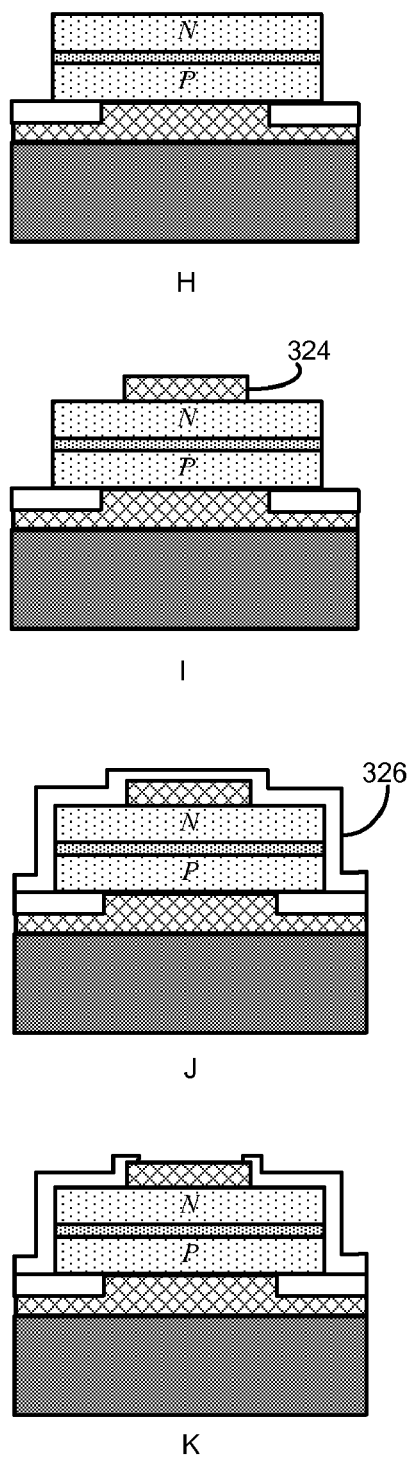

FIG. 3 presents a diagram illustrating the process of fabricating a light-emitting device with double-sided passivation in accordance with one embodiment of the present invention. In operation A, after a pre-patterned substrate with grooves and mesas is prepared, an InGaAlN multilayer structure can be formed using various growth techniques, which can include but are not limited to Metalorganic Chemical Vapor Deposition (MOCVD). The fabricated LED structure can include a substrate 302, which can be a Si wafer, an n-type doped semiconductor layer 304, which can be a Si doped GaN layer, an active layer 306, which can be a GaN/InGaN MQW structure, and a p-type doped semiconductor layer 308, which can be a Mg doped GaN layer. Note that it is possible to reverse the sequence of the growth between the p-type layer and n-type layer.

In operation B, a first (bottom) passivation layer 310 is deposited on the top of the p-type doped semiconductor layer. Materials that can be used to form bottom passivation layer 310 include, but are not limited to: silicon oxide ($SiO_x$), silicon nitride ($SiN_x$), and silicon oxynitride ($SiO_xN_y$). Various thin-film deposition techniques, such as PECVD and magnetron sputtering deposition, can be used to deposit bottom passivation layer 310. The thickness of the bottom passivation layer can fall between 100 and 2,000 angstroms. In one embodiment, the bottom passivation layer is approximately 500 angstroms thick. The figure corresponding to operation B shows the cross-section after the deposition of the bottom passivation layer 310.

In order to make room for an ohmic contact between the p-type doped semiconductor layer and an electrode (the p-side electrode), in operation C, photolithographic and etching techniques are applied to etch off part of passivation layer 312. In one embodiment, the area to be etched off is selected such that both a sufficient area for electrical contact and a sufficient distance between the p-side electrode and edges of the device can be attained.

In operation D, after the etching of bottom passivation layer 312, a metal layer 314 is deposited above the multilayer structure 316 to form an electrode. If the top layer of the multilayered structure is p-type doped material, then the electrode is a p-side electrode. The p-side electrode may include several types of metal such as nickel (Ni), gold (Au), platinum (Pt), and an alloy thereof. Metal layer 314 can be deposited using an evaporation technique such as electro-beam (e-beam) evaporation.

In operation E, multilayer structure 316 is flipped upside down to bond with a supporting conductive structure 318. Note that, in one embodiment, supporting conductive structure 318 includes a supporting substrate 320 and a bonding layer 322. In addition, a layer of bonding metal can be deposited on metal layer 314 to facilitate the bonding process. Supporting substrate layer 320 is conductive and may include silicon (Si), copper (Cu), silicon carbide (SiC), chromium (Cr), and other materials. Bonding layer 322 may include gold (Au). FIG. 4F illustrates the multilayer structure after boding.

After bonding, in operation G, substrate 302 is removed. Techniques that can be used for the removal of the substrate layer 302 can include, but are not limited to: mechanical grinding, dry etching, chemical etching, and any combination of the above methods. In one embodiment, the removal of substrate 302 is completed by employing a chemical etching process, which involves submerging the multilayer structure in a solution based on hydrofluoric acid, nitric acid, and acetic acid. Note that supporting substrate layer 320 can be optionally protected from this chemical etching.

In operation H, the edge of the multilayer structure is removed to reduce surface recombination centers and ensure high material quality throughout the entire device. However, if the growth procedure can guarantee a good edge quality of the multilayer structure, then this edge removal operation can be optional.

In operation I, after the edge removal, another electrode 324 is formed on top of the multilayer structure. Note that, because multilayer structure 312 was flipped upside down during the wafer bonding process, the top layer is now the n-type doped semiconductor. Thus, the newly formed electrode is the n-side electrode. The metal composition and the forming process of the n-side electrode can be similar to that of the p-side electrode.

In operation J, a second (or top) passivation layer 326 is deposited. Materials that can be used to form the top passivation layer include, but are not limited to, the following: $SiO_x$, $SiN_x$, and $SiO_xN_y$. Note that, one can choose either the same or different materials to form the top and bottom passivation layers. Various thin-film deposition techniques, such as PECVD and magnetron sputtering deposition, can be used to deposit the top passivation layer. The thickness of the top passivation layer can be between 300 and 10,000 angstroms. In one embodiment, the top passivation layer has a thickness of approximately 2,000 angstroms.

In operation K, photolithographic patterning and etching are applied to top passivation layer 326 to expose the n-side electrode.

EXAMPLES

In one embodiment, a conventional substrate is patterned and etched to form individual mesas. Each mesa has a size of approximately 300×300 $\mu m^2$. A 500-angstrom-thick $SiO_2$ layer forms the bottom passivation layer, and a 2,000-angstrom-thick $SiO_2$ layer forms the top passivation layer. After etching, the size of the p-side electrode is approximately 250×250 $\mu m^2$. The top surface area of the device after edge removal is approximately 280×280 $\mu m^2$.

In one embodiment, each mesa has a size of approximately 300×300 $\mu m^2$. A 500-angstrom-thick $SiO_2$ layer forms the bottom passivation layer, and a 2,000-angstrom-thick $SiN_x$ layer forms the top passivation layer. After etching, the size of the p-side electrode is approximately 250×250 $\mu m^2$. The top surface area of the device after edge removal is approximately 280×280 $\mu m^2$.

In one embodiment, each mesa has a size of approximately 300×300 $\mu m^2$. A 100-angstrom-thick $SiN_x$ layer forms the bottom passivation layer, and a 5,000-angstrom-thick $SiN_x$ layer forms the top passivation layer. After etching, the size of the p-side electrode is approximately 260×260 $\mu m^2$. The top surface area of the device after edge removal is approximately 280×280 $\mu m^2$.

In one embodiment, each mesa has a size of approximately 300×300 $\mu m^2$. A 1,000-angstrom-thick $SiN_x$ layer forms the bottom passivation layer, and a 500-angstrom-thick $SiO_2$ layer forms the top passivation layer. After etching, the size of the p-side electrode is approximately 230×230 $\mu m^2$. The top surface area of the device after edge removal is approximately 280×280 $\mu m^2$.

In one embodiment, each mesa has a size of approximately 300×300 $\mu m^2$. A 500-angstrom-thick $SiO_2$ layer forms the bottom passivation layer, and a 10,000-angstrom-thick $SiO_2$ layer forms the top passivation layer. After etching, the size of the p-side electrode is approximately 230×230 $\mu m^2$. The top surface area of the device after edge removal is approximately 280×280 $\mu m^2$.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A semiconductor light-emitting device, comprising:
   a substrate;
   a first doped semiconductor layer situated above the substrate;
   a second doped semiconductor layer situated above the first doped semiconductor layer;
   a multi-quantum-well (MQW) active layer situated between the first and the second doped semiconductor layers; and
   a first electrode coupled to the first doped semiconductor layer;
   a first passivation layer, which is situated between the first electrode and the first doped semiconductor layer in areas other than an ohmic-contact area, wherein the first passivation layer substantially insulates the first electrode from the edges of the first doped semiconductor layer, thereby reducing surface recombination;
   a second electrode coupled to the second doped semiconductor layer; and
   a second passivation layer which substantially covers the sidewalls of the first and second doped semiconductor layer, the MQW active layer, and part of the horizontal surface of the second doped semiconductor layer which is not covered by the second electrode.

2. The semiconductor light-emitting device of claim 1, wherein the substrate comprises at least one of the following materials:
   Cu,
   Cr,
   Si, and
   SiC.

3. The semiconductor light-emitting device of claim 1, wherein the first and/or second passivation layer comprises at least one of the following materials:
   silicon oxide ($SiO_x$),
   silicon nitride ($SiN_x$), and
   silicon oxynitride ($SiO_xN_y$).

4. The semiconductor light-emitting device of claim 1, wherein the first doped semiconductor layer is a p-type doped semiconductor layer.

5. The semiconductor light-emitting device of claim 1, wherein the second doped semiconductor layer is an n-type doped semiconductor layer.

6. The semiconductor light-emitting device of claim 1, wherein the MQW active layer comprises GaN and InGaN.

7. The semiconductor light-emitting device of claim 1, wherein the first and second doped semiconductor layers are grown on a substrate with a pre-defined pattern of grooves and mesas.

8. The semiconductor light-emitting device of claim 1, wherein the first and/or second passivation layer is formed by at least one of the following processes:
plasma-enhanced chemical vapor deposition (PECVD),
magnetron sputtering deposition, or
electro-beam (e-beam) evaporation.

9. The semiconductor light-emitting device of claim 1, wherein the thickness of the first passivation layer is between 100 and 2000 angstroms, and wherein the thickness of the second passivation layer is between 300 and 10,000 angstroms.

10. The semiconductor light-emitting device of claim 1, wherein a substantial distance is present between the edge of the first electrode and the edge of other layers.

11. A method for fabricating a semiconductor light-emitting device, the method comprising:
growing a multilayer semiconductor structure on a first substrate, wherein the multilayer semiconductor structure comprises a first doped semiconductor layer, an MQW active layer, and a second doped semiconductor layer;
forming a first passivation layer, which substantially insulates the edges of the first doped semiconductor from a subsequently grown first electrode;
forming a first electrode, which is coupled to the first doped semiconductor layer;
bonding the multilayer structure to a second substrate;
removing the first substrate;
forming a second electrode, which is coupled to the second doped semiconductor layer; and
forming a second passivation layer, which substantially covers the sidewalls of first and second doped semiconductor layers, the MQW active layer, and part of the surface of the second doped semiconductor layer which is not covered by the second electrode.

12. The method of claim 11, wherein the second substrate comprises at least one of the following materials:
Cu,
Cr,
Si, and
SiC.

13. The method of claim 11, wherein the first and/or second passivation layers comprise at least one of the following materials:
silicon oxide ($SiO_x$),
silicon nitride ($SiN_x$), and
silicon oxynitride ($SiO_xN_y$).

14. The method of claim 11, wherein the first doped semiconductor layer is a p-type doped semiconductor layer.

15. The method of claim 11, wherein the second doped semiconductor layer is an n-type doped semiconductor layer.

16. The method of claim 11, wherein the MQW active layer comprises GaN and InGaN.

17. The method of claim 11, wherein the first substrate comprises a pre-defined pattern of grooves and mesas.

18. The method of claim 11, wherein the first and/or second passivation layers are formed by one of the following processes:
plasma-enhanced chemical vapor deposition (PECVD),
magnetron sputtering deposition, and
e-beam deposition.

19. The method of claim 11, wherein the thickness of the first passivation layer is between 100 and 2,000 angstrom, and wherein the thickness of the second passivation layer is between 300 and 10,000 angstrom.

20. The method of claim 11, wherein a substantial distance is present between the edge of the first electrode and the edge of the multilayer structure.

* * * * *